United States Patent [19]
Robles et al.

[11] Patent Number: 6,035,803
[45] Date of Patent: Mar. 14, 2000

[54] METHOD AND APPARATUS FOR CONTROLLING THE DEPOSITION OF A FLUORINATED CARBON FILM

[75] Inventors: Stuardo Robles, Cupertino; Wai-Fan Yau, Mountain View; Ping Xu, Cupertino; Kaushal Singh, Santa Clara, all of Calif.

[73] Assignee: Applied Materials, Inc., Santa Clara, Calif.

[21] Appl. No.: 08/939,179

[22] Filed: Sep. 29, 1997

[51] Int. Cl.[7] ................................................. C23C 16/00
[52] U.S. Cl. ........................................ 118/723 E; 156/345
[58] Field of Search ........................... 118/723 E; 156/345

[56] References Cited

U.S. PATENT DOCUMENTS

| | | | |
|---|---|---|---|
| 5,661,093 | 8/1997 | Ravi | 438/763 |
| 5,804,259 | 9/1998 | Robles | 427/577 |
| 5,804,471 | 9/1998 | Yamazaki | 438/154 |

*Primary Examiner*—Bruce Breneman
*Assistant Examiner*—Erin Fieler
*Attorney, Agent, or Firm*—Townsend & Townsend & Crew

[57] ABSTRACT

A process for depositing a dielectric film having a reduced dielectric constant and desirable gap-fill characteristics, at an acceptable deposition rate is disclosed. A filmed deposited according to the present invention possesses acceptable stability, and avoids outgassing of the halogen dopant while resisting shrinkage.

A carbon-based dielectric film is deposited on a substrate in a processing chamber by first flowing a process gas into the processing chamber. The process gas includes a gaseous source of carbon (such as methane ($CH_4$)) and a gaseous source of a halogen (such as a source of fluorine (e.g., $C_4F_8$)). A plasma is then formed from the process gas by applying a first and a second RF power component. Preferably, the second RF component has a frequency of between about 200 kHz and 2 MHz and a power level of between about 5 W and 75 W. The first and a second RF power components are applied for a period of time to deposit a halogen-doped carbon-based layer. The resulting carbon-based film has a low dielectric constant and good gap-fill. The film also exhibits minimal shrinkage during subsequent processing, and may then be annealed.

26 Claims, 13 Drawing Sheets

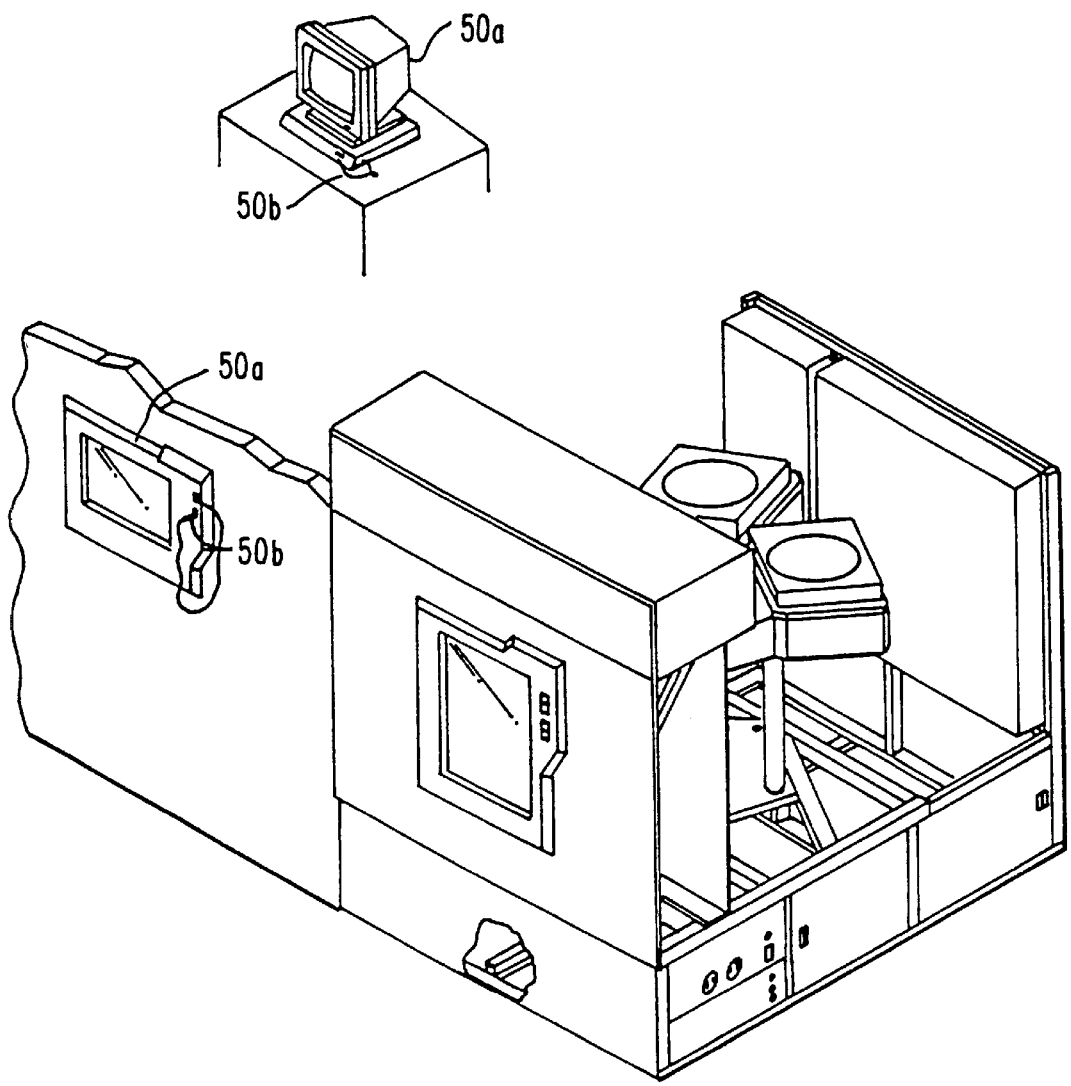
FIG. IE.

METHOD AND APPARATUS FOR CONTROLLING THE DEPOSITION OF A FLUORINATED CARBON FILM

CROSS-REFERENCE TO RELATED APPLICATIONS

This application is related to patent application Ser. No. 08/774,930, entitled "INTEGRATED LOW DIELECTRIC CONSTANT PROCESS FOR IMD APPLICATIONS USING CARBON, SILICON, AND FLUORINE-BASED MATERIALS," having Stuardo Robles as inventor. This applications is assigned to Applied Materials, Inc., the assignee of the present invention, and is hereby incorporated by reference.

BACKGROUND OF THE INVENTION

The present invention relates to the fabrication of integrated circuits. In particular, the invention provides a technique, including a method and apparatus, for control of the deposition of a dielectric film having a reduced dielectric constant. In addition, the dielectric film can also be made to resist outgassing and shrinkage by the novel use of low-frequency radio-frequency (RF) power.

Many very large scale integrated (VLSI) semiconductor devices employ multilevel interconnects to increase the packing density of devices on a substrate. Typically, such devices include intermetal dielectric (IMD) layers that insulate adjacent metalization layers from one another. The capacitance between these metalization layers may be reduced by reducing the dielectric constant of the IMD between them. The dielectric constant of these layers has a direct impact on the size of device that can be produced. For example, one semiconductor industry association projects that the ability to mass produce sub-0.25 $\mu$m devices will require the use of IMD layers having dielectric constants of 2.9 or less. Thus, there is a continuing need for IMD layers having reduced dielectric constants.

Other properties of these IMD layers are also important. For example, IMD layers should have good "gap-fill" characteristics, namely, the layers should exhibit good step coverage and planarization properties to produce void-free layers that not only completely fill steps and openings in the underlying substrate, but also form smooth planarized dielectric layers. The layers should be able to be deposited at low temperatures, preferably below about 400° C. to avoid damage to underlying metalization layers.

A number of existing approaches to the deposition of IMD layers include the formation and deposition of several layers of silicon oxide film. This deposition typically is performed using chemical vapor deposition (CVD). Conventional thermal CVD processes supply reactive gases to the substrate surface where heat-induced chemical reactions take place to produce a desired film. Other processes use a plasma to deposit the film (plasma-enhanced CVD, or PECVD). Other deposition techniques employ halogen dopants to reduce the deposited film's dielectric constant and improve gap-filling capabilities. Although these films have been found to possess desirable qualities and are well-suited for some applications, other applications may require the use of films having even lower dielectric constants. There is, accordingly, a need for dielectric films having reduced dielectric constants that are suitable for use in these other applications.

Moreover, such low-dielectric films should exhibit good film stability. This is especially true with respect to the stability of halogen-doped films, which may experience unacceptable levels of outgassing and shrinkage, for example. Also of concern in commercial environments is the substrate processing system's throughput. System throughput may be increased by maximizing the rate at which the substrate processing system deposits a film. Thus, it is desirable to maximize the film's deposition rate.

What is therefore needed is a process by which a film, having a reduced dielectric constant and good gap-filling capabilities, may be deposited at an acceptable rate. Moreover, a film so deposited should exhibit acceptable stability.

SUMMARY OF THE INVENTION

The present invention addresses these requirements by providing a mixed-frequency plasma process for depositing, at an acceptable deposition rate, a carbon-based dielectric film having a reduced dielectric constant and desirable gap-fill characteristics. By suitably adjusting the low-frequency RF power applied to the plasma, a film so deposited can be made to resist dopant outgassing and film shrinkage during subsequent processing.

According to one embodiment of the invention, a carbon-based dielectric film is deposited on a substrate in a processing chamber by first flowing a process gas into the processing chamber. The process gas includes a gaseous source of carbon (such as methane ($CH_4$)) and a gaseous source of a halogen (such as a source of fluorine (e.g., $C_4F_8$)). A plasma is then formed from the process gas by applying a first and a second RF power component. Preferably, the second RF component has a relatively low frequency of between about 200 kHz and 2 MHz, and a plasma density of between about 0.004 W/cm$^2$ and 0.06 W/cm$^2$. The first and a second RF power components are applied for a period of time, thereby depositing a halogen-doped carbon-based layer. The resulting film has a low dielectric constant and good gap-fill. The film also exhibits minimal shrinkage during subsequent processing.

The deposition of the halogen-doped carbon-based layer may be preceded by the deposition of a carbon-based lining layer, which reduces outgassing of the halogen dopant and improves adhesion between the dielectric film and the substrate. First, a second process gas comprising a second gaseous source of carbon is introduced into the processing chamber. This process gas is then excited using a third RF component, thus forming a plasma from the second process gas. The plasma is maintained for a period of time to deposit the carbon-based lining layer. Preferably, the carbon-based lining layer is deposited to a thickness of between about 100 Å and 300 Å.

The deposition of the halogen-doped carbon-based layer may be followed by the deposition of a carbon-based capping layer, which reduces outgassing of the halogen dopant and improves adhesion between the dielectric film and layers subsequently deposited over the dielectric film. First, a second process gas comprising a second gaseous source of carbon is introduced into the processing chamber. This process gas is then excited using a third RF component, thus forming a plasma from the second process gas. The plasma is maintained for a period of time to deposit the carbon-based capping layer. Preferably, the carbon-based capping layer is deposited to a thickness of between about 100 Å and 300 Å.

According to a further embodiment of the invention, at least the second RF component is couple to the plasma by an electrode positioned opposite to the electrode on which the substrate is disposed.

For a further understanding of the objects and advantages of the present invention, reference should be made to the ensuing detailed description taken in conjunction with the accompanying drawings.

BRIEF DESCRIPTION OF THE DRAWINGS

FIG. 1E is a simplified diagram of a system monitor and a CVD system in a system which may include one or more chambers;

DETAILED DESCRIPTION OF THE PREFERRED EMBODIMENTS

I. Introduction

The present invention allows control over the film stability and deposition rate of a dielectric film by controlling the low-frequency RF power used in the layer's deposition. Such a dielectric film is composed at least partially of amorphous carbon (also known as diamond-like carbon, or DLC), has a relatively low dielectric constant (between 2.2 and 3.5 in some embodiments) and exhibits desirable gap-fill characteristics. The dielectric film can also be made to resist outgassing and shrinkage by the application of a proper level of low-frequency RF power. Preferably, the low-frequency RF power is applied to the plasma from an electrode opposite the substrate being processed (as opposed to the electrode upon which the substrate rests). A dielectric film according to the present invention may be deposited in CVD chambers of conventional design.

II. Exemplary CVD System

Figure 1A:
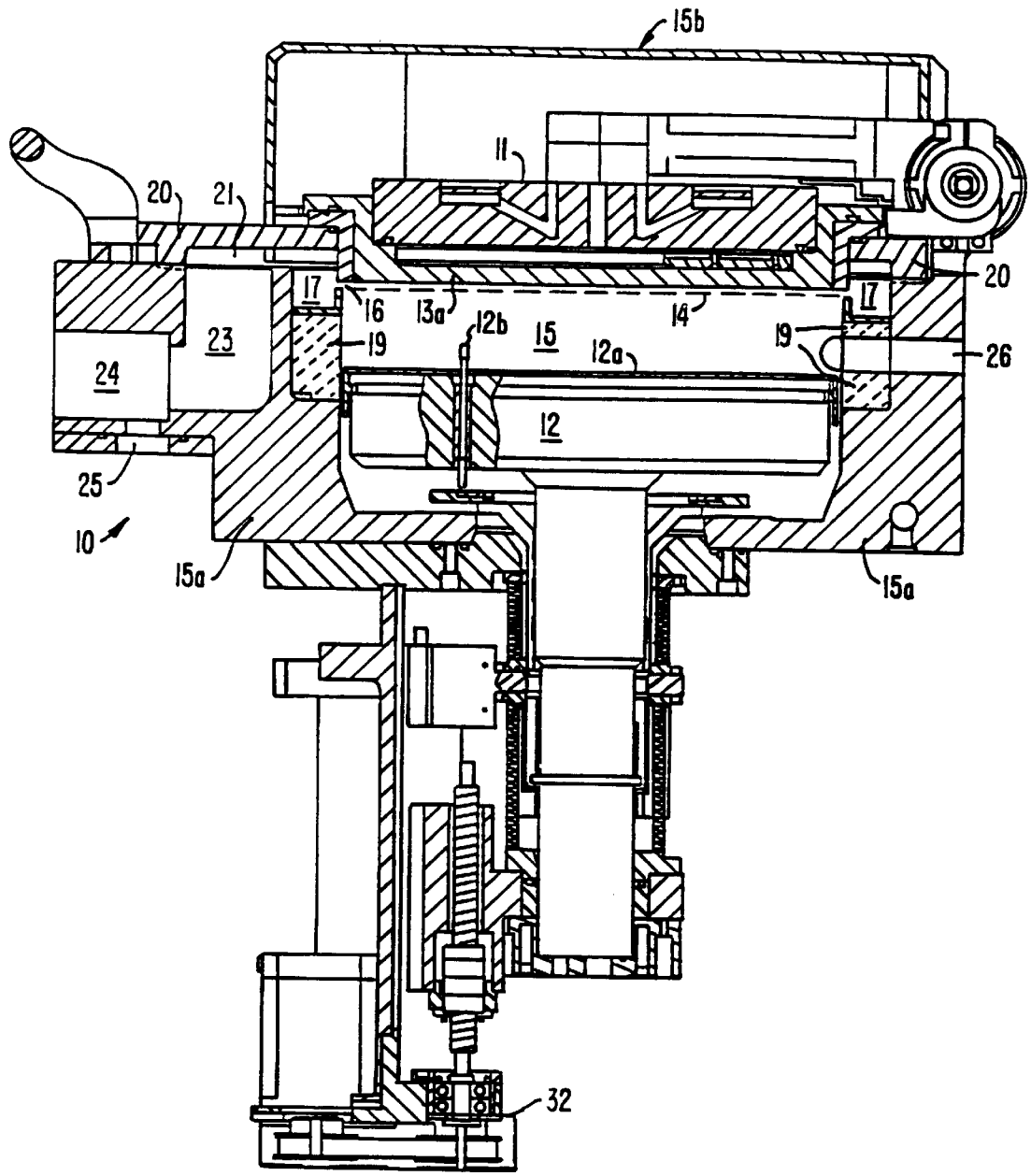
FIGS. 1A and 1B are vertical, cross-sectional views of one embodiment of an exemplary substrate processing system which may be used in accordance with the present invention.
Figure 1B:
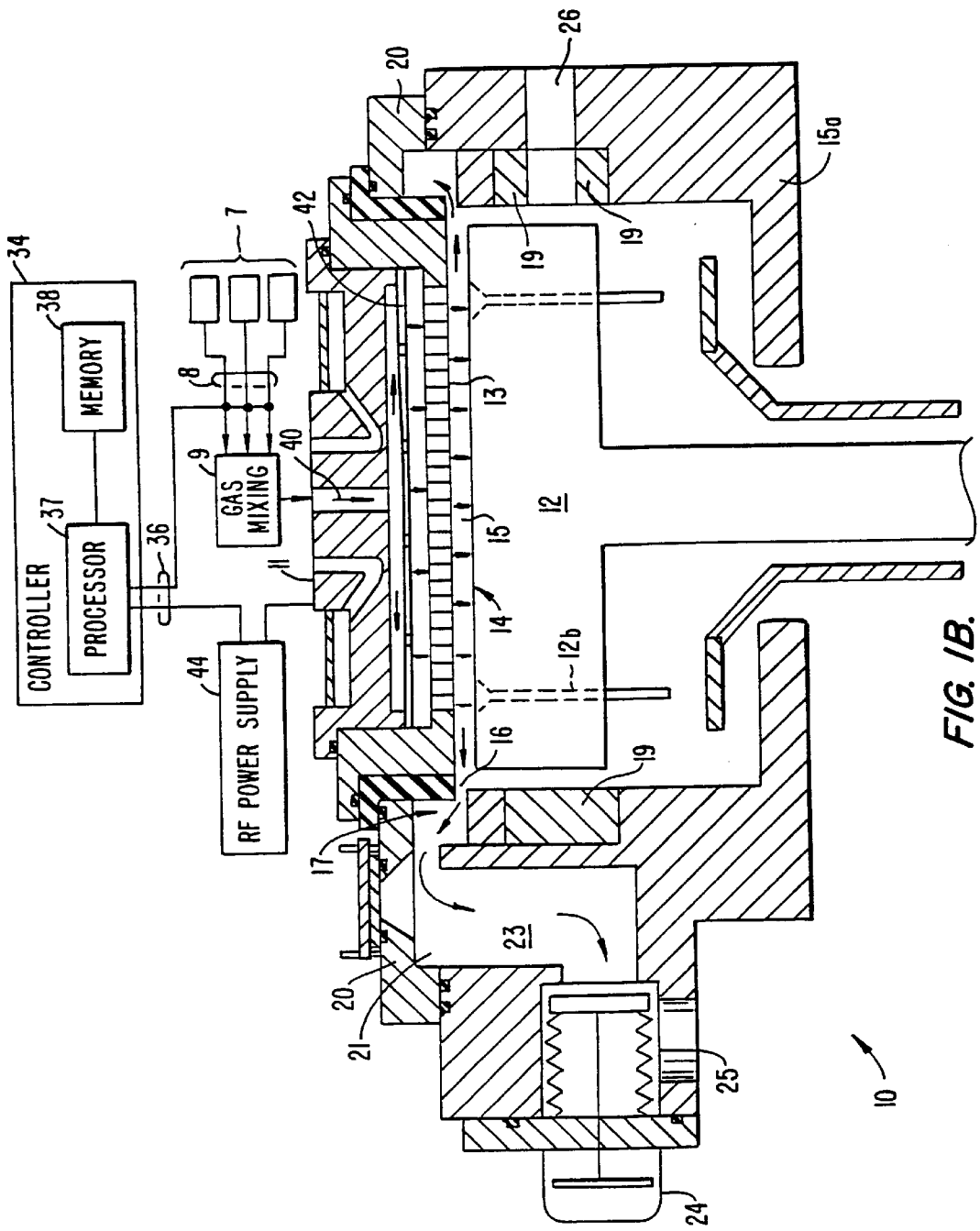
Figure 1C:
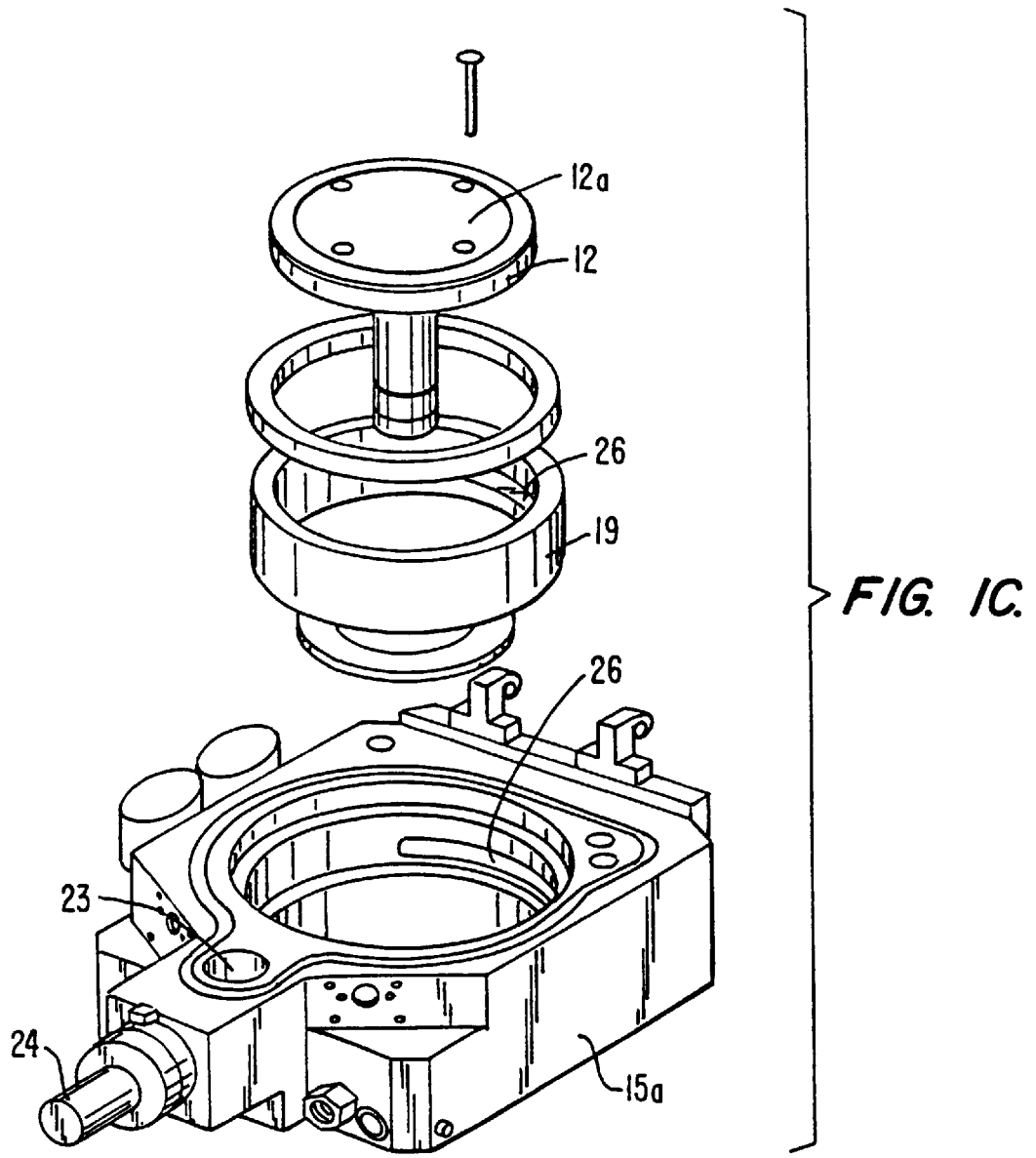
FIGS. 1C and 1D are exploded perspective views of parts of the CVD system depicted in FIG. 1A.
Figure 1D:
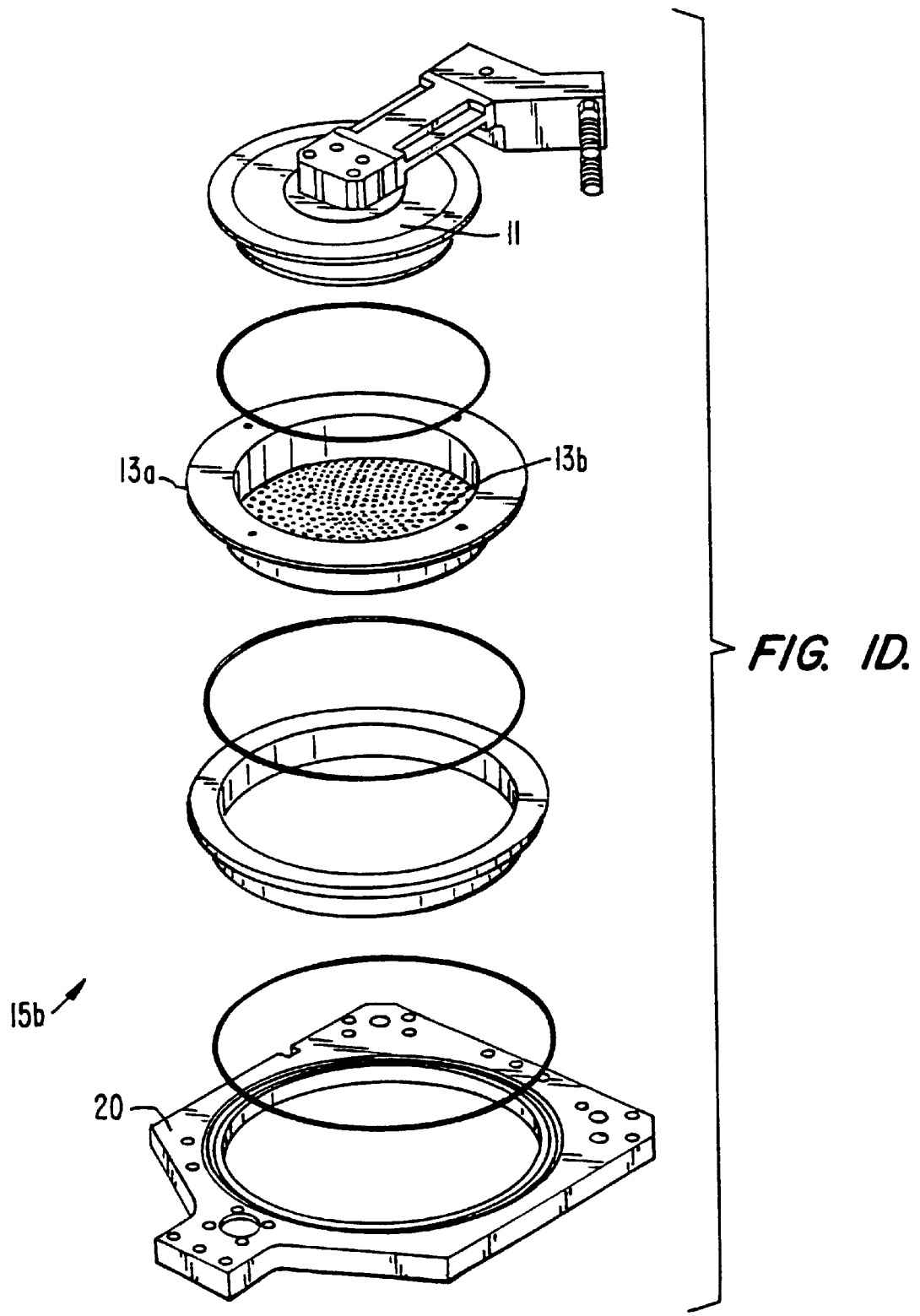

Specific embodiments of the present invention may be deposited using a variety of chemical vapor deposition (CVD) or other types of substrate processing systems. One suitable substrate processing system in which the method of the present invention may be practiced is shown in FIGS. 1A and 1B, which are vertical, cross-sectional views of a CVD system 10, having a vacuum or processing chamber 15 that includes a chamber wall 15a and chamber lid assembly 15b. Chamber wall 15a and chamber lid assembly 15b are shown in exploded, perspective views in FIGS. 1C and 1D.

CVD system 10 contains a gas distribution manifold 11 for dispersing process gases to a substrate (not shown) that rests on a resistively-heated pedestal 12 centered within the process chamber. The volume between gas distribution manifold 11 and pedestal 12 is referred to herein as a deposition zone. A portion of this volume may also be referred to in this manner. During processing, the substrate (e.g., a semiconductor substrate) is positioned on a flat (or slightly convex) surface 12a of pedestal 12. Preferably having a surface of ceramic such as aluminum nitride, pedestal 12 can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the substrates. Deposition and carrier gases flow into chamber 15 through perforated holes 13b (FIG. 1D) of a conventional flat, circular gas distribution face plate 13a. More specifically, deposition process gases flow (indicated by arrow 40 in FIG. 1B) into the chamber through the inlet manifold 11, through a conventional perforated blocker plate 42 and then through holes 13b in gas distribution faceplate 13a.

Before reaching the manifold, deposition and carrier gases are input from gas sources 7 through gas supply lines 8 (FIG. 1B) into a gas mixing block or system 9 where they are combined and then sent to manifold 11. It is also possible, and desirable in some instances, to direct deposition and carrier gases directly from supply lines 8 to manifold 11, bypassing gas mixing system 9. In other situations, any of gas lines 8 may bypass gas mixing system 9 and introduce gases through passages (not shown) in the bottom of chamber 12.

Generally, the supply line for each process gas includes (i) several safety shut-off valves (not shown) that can be used to automatically or manually shut off the flow of process gas into the chamber, and (ii) mass flow controllers (MFCs) (also not shown) that measure the flow of gas through the supply line. When toxic gases are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and pedestal 12 to excite the process gas mixture to form a plasma within the cylindrical region between the faceplate 13a and pedestal 12. Constituents of the plasma react to deposit a desired film on the surface of the semiconductor substrate supported on pedestal 12. RF power supply 44 can be a mixed frequency RF power supply that typically supplies power at a high RF frequency (RF1) of 13.56 MHz and at a low RF frequency (RF2) of 360 kilohertz (kHz) to enhance the decomposition of reactive species introduced into the vacuum chamber 15. Of course, RF power supply 44 can supply either single- or mixed-frequency RF power (or other desired variations) to manifold 11 to enhance the decomposition of reactive species introduced into chamber 15. In a thermal process, RF power supply 44 is not utilized, and the process gas mixture thermally reacts to deposit the desired fim on the surface of the semiconductor substrate supported on pedestal 12, which is resistively heated to provide the thermal energy needed for the reacion.

During a thermal CVD deposition process, pedestal 12 is heated, causing heating of CVD system 10. Pedestal 12 may also be heated during a plasma CVD process to enhance reactions within processing chamber 15. In a hot-wall system, of the type previously mentioned, a hot liquid may be circulated through chamber wall 15a to maintain chamber wall 15a at an elevated temperature when the plasma is not turned on, or during a thermal deposition process. Fluids used to heat chamber wall 15a include the typical fluid types (i.e., water-based ethylene glycol or oil-based thermal transfer fluids). This heating beneficially reduces or eliminates condensation of undesirable reactant products and improves the elimination of volatile products of the process gases and contaminants that might otherwise condense on the walls of cool vacuum passages and migrate back into the processing chamber during periods of no gas flow. In a cold-wall system, chamber wall 15a is not heated. This might be done, for example, during a plasma-enhanced deposition process. In such a process, the plasma heats chamber 15, including chamber wall 15a surrounding exhaust passageway 23 and shut-off valve 24. However, because the plasma is unlikely to be in equal proximity to all chamber surfaces, variations in surface temperature may occur, as previously noted.

The remainder of the gas mixture that is not deposited in a layer, including reaction products, is evacuated from the chamber by a vacuum pump (not shown). Specifically, the gases are exhausted through an annular slot 16 surrounding the reaction region and into an annular exhaust plenum 17. Annular slot 16 and plenum 17 are defined by the gap between the top of chamber wall 15a (including upper dielectric lining 19) and the bottom of circular chamber lid 20. The 360° circular symmetry and uniformity of annular slot 16 and plenum 17 are important to achieving a uniform flow of process gases over the substrate so as to deposit a uniform film on the substrate. The gases flow underneath a lateral extension portion 21 of exhaust plenum 17, past a viewing port (not shown), through a downward-extending gas passage 23, past a vacuum shut-off valve 24 (whose body is integrated with a lower portion of chamber wall 15a), and into an exhaust outlet 25 that connects to the external vacuum pump through a foreline (not shown).

The substrate support platter of resistively-heated pedestal 12 is heated using an embedded single-loop embedded heater element configured to make two full turns in the form of concentric circles. An outer portion of the heater element runs adjacent to a perimeter of the support platter, while an inner portion runs on the path of a concentric circle having a smaller radius. The wiring to the heater element passes through the stem of pedestal 12. Pedestal 12 may be made of material including aluminum, ceramic, or some combination thereof.

Typically, any or all of the chamber lining, gas inlet manifold faceplate, and various other processing chamber hardware are made out of material such as aluminum, anodized aluminum, or a ceramic material. An example of such CVD apparatus is described in commonly assigned U.S. Pat. No. 5,558,717 entitled "CVD Processing Chamber," issued to Zhao et al., hereby incorporated by reference in its entirety.

A lift mechanism and motor 32 (FIG. 1A) raises and lowers pedestal 12 and its substrate lift pins 12b as substrates are transferred by a robot blade (not shown) into and out of the body of the chamber through an insertion/removal opening 26 in the side of chamber 10. Motor 32 raises and lowers pedestal 12 between a processing position 14 and a lower substrate-loading position. Motor 32, various valves and MFCs of the gas delivery system, and other components of CVD system 10 are controlled by a system controller 34 (FIG. 1B) over control lines 36, of which only some are shown. Controller 34 relies on feedback from optical sensors to determine the position of movable mechanical assemblies such as the throttle valve and pedestal which are moved by appropriate motors controlled by controller 34.

In a preferred embodiment, system controller 34 includes a hard disk drive (a memory 38), a floppy disk drive (not shown), and a processor 37. Processor 37 contains a single-board computer (SBC), analog and digital input/output boards, interface boards, and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of CVD system 10. System controller 34 executes system control software, which is a computer program stored in a computer-readable medium such as memory 38. Preferably, memory 38 is a hard disk drive, but memory 38 may also be other kinds of memory. The computer program includes sets of instructions that dictate the timing, mixture of gases, chamber pressure, chamber temperature, RF power levels, pedestal position, and other parameters of a particular process. Other computer programs stored on other memory devices including, for example, the floppy disk or other another appropriate drive, may also be used to operate system controller 34.

The interface between a user and controller 34 is via a CRT monitor 50a and light pen 50b, shown in FIG. 1E, which is a simplified diagram of the system monitor and CVD system 10 in a substrate processing system, which may include one or more chambers. In the preferred embodiment two CRT monitors 50a are used, one mounted in the clean room wall for the operators and the other behind the wall for the service technicians. CRT monitors 50a simultaneously display the same information, but only one light pen 50b is enabled. A light sensor in the tip of light pen 50b detects light emitted by CRT monitor 50a. To select a particular screen or function, the operator touches a designated area of the display screen and pushes the button on pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with system controller 34.

The process for depositing the film can be implemented using a computer program product that is executed by system controller 34. The computer program code can be written in any conventional computer readable programming language: for example, 68000 assembly language, C, C++, Pascal, Fortran or others. Suitable program code is entered into a single file, or multiple files, using a conventional text editor and stored or embodied in a computer-usable medium, such as a memory system of the computer. If the entered code text is in a high level language, the code is compiled, and the resultant compiler code is then linked with an object code of precompiled Windows library routines. To execute the linked, compiled object code the system user invokes the object code, causing the computer system to load the code in memory. The CPU then reads and executes the code to perform the tasks identified in the program.

Figure 1F:
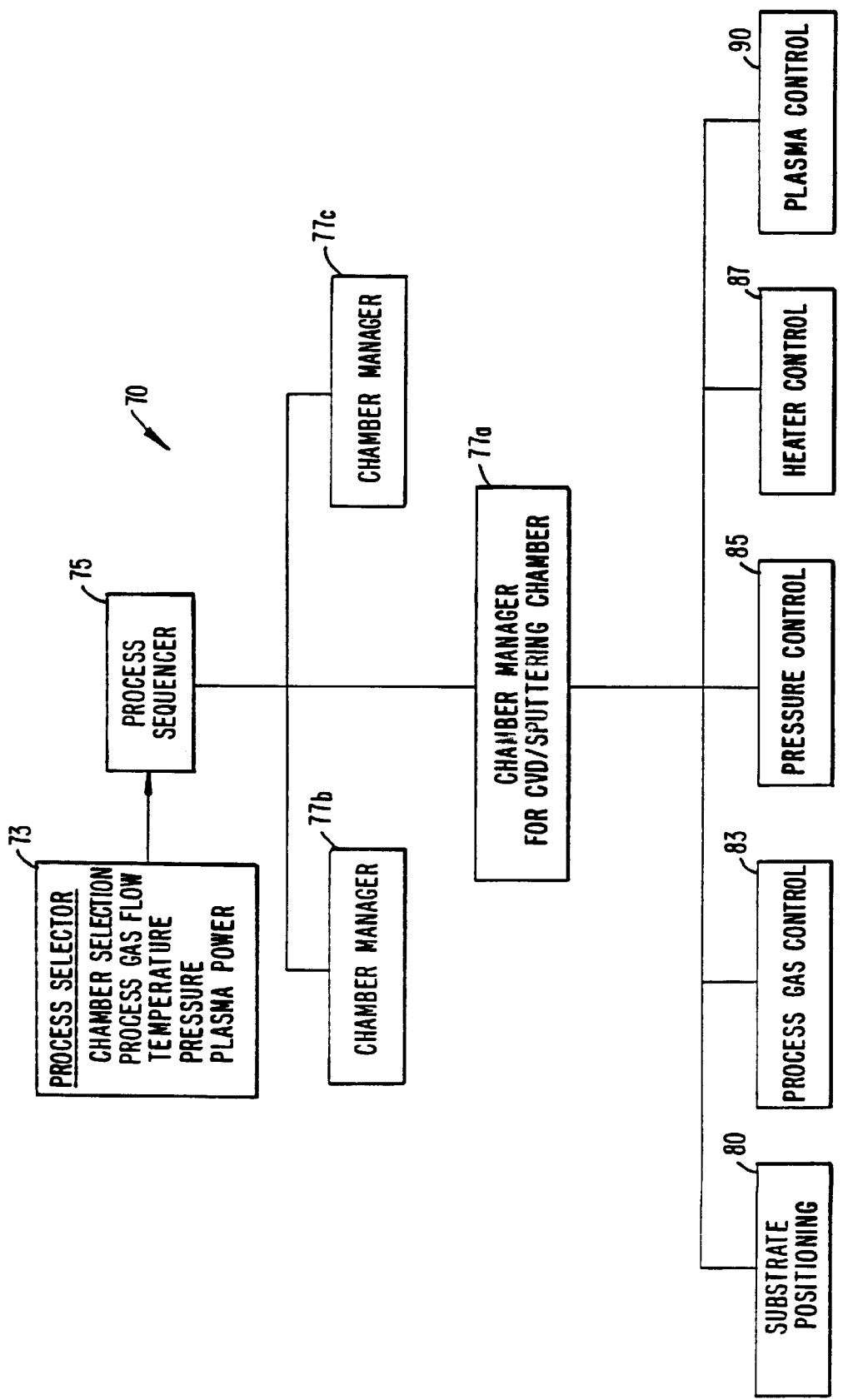
FIG. 1F shows an illustrative block diagram of the hierarchical control structure of the system control software according to a specific embodiment.

FIG. 1F is an illustrative block diagram of the hierarchical control structure of the system control software, a computer program 70, according to a specific embodiment. Using the light pen interface, a user enters a process set number and process chamber number into a process selector subroutine 73 in response to menus or screens displayed on CRT monitor 50a. The process sets are predetermined sets of process parameters necessary to carry out specified processes, and are identified by predefined set numbers. Process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as microwave power levels or RF power levels and the low frequency RF frequency, cooling gas pressure, and chamber wall temperature. These parameters are provided to the user in the form of a recipe and are entered utilizing the light penlCRT monitor interface. The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from process selector subroutine 73 and for controlling operation of the various process chambers. Multiple users can enter process set numbers and process chamber numbers, or a user can enter multiple process set numbers and process chamber number, so process sequencer subroutine 75 operates to schedule the selected processes in the desired sequence. Preferably, process sequencer subroutine 75 includes code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, process sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once it determines which process chamber and process set combination is to be executed, process sequencer subroutine 75 initiates execution of the process set by passing the particular process set parameters to chamber manager subroutines 77a–c, which control multiple processing tasks in process chamber 15 according to the process set determined by process sequencer subroutine 75. For example, chamber manager subroutine 77a comprises program code for controlling sputtering and CVD process operations in process chamber 15. Chamber manager subroutines 77a–c also control execution of various chamber component subroutines that control operation of the chamber components necessary to carry out the selected process set. Examples of chamber component subroutines are a substrate positioning subroutine 80, a process gas control subroutine 83, a pressure control subroutine 85, a heater control subroutine 87, and a plasma control subroutine 90. Those having ordinary skill in the art will readily recognize that other chamber control subroutines can be included depending on what processes are to be performed in process chamber 15.

In operation, chamber manager subroutine 77a selectively schedules or calls the process component subroutines in accordance with the particular process set being executed. Chamber manager subroutine 77a schedules the process component subroutines much like process sequencer subroutine 75 schedules the process set to be executed and the chamber in which to execute it. Typically, chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1F. Substrate positioning subroutine 80 comprises program code for controlling chamber components that are used to load the substrate onto pedestal 12, to lift the substrate to a desired height in process chamber 15, and to control the spacing between the substrate and gas distribution manifold 11. When a substrate is loaded into process chamber 15, pedestal 12 is lowered to receive the substrate, and thereafter, pedestal 12 is raised to the desired height in process chamber 15, to maintain the substrate at a desired distance or spacing from gas distribution manifold 11 during processing. In operation, substrate positioning subroutine 80 controls movement of pedestal 12 in response to process set parameters, related to the support height, that are transferred from chamber manager subroutine 77a.

Process gas control subroutine 83 has program code for controlling process gas composition and flow rates. Process gas control subroutine 83 controls the open/close position of the safety shut-off valves, and also ramps up/down the mass flow controllers to obtain the desired gas flow rate. Process gas control subroutine 83 is invoked by chamber manager subroutine 77a, as are all chamber component subroutines, and receives from the chamber manager subroutine process parameters related to the desired gas flow rates. Typically, process gas control subroutine 83 operates by opening the gas supply lines and repeatedly (i) reading the necessary mass flow controllers, (ii) comparing the readings to the desired flow rates received from chamber manager subroutine 77a, and (iii) adjusting the flow rates of the gas supply lines as necessary. Furthermore, process gas control subroutine 83 includes steps for monitoring the gas flow rates for unsafe rates and for activating the safety shut-off valves when an unsafe condition is detected.

In some processes, an inert gas such as helium or argon is flowed into process chamber 15 to stabilize the pressure in the chamber before reactive process gases are introduced. For these processes, process gas control subroutine 83 is programmed to include steps for flowing the inert gas into chamber 15 for an amount of time necessary to stabilize the pressure in chamber 15, and then the above-described steps performed. Additionally, if a process gas is to be vaporized from a liquid precursor (e.g., TEOS), process gas control subroutine 83 is written to include steps for bubbling a delivery gas, such as helium, through the liquid precursor in a bubbler assembly or introducing a carrier gas, such as helium or nitrogen, into a liquid injection system. When a bubbler is used for this type of process, process gas control subroutine 83 regulates the flow of the delivery gas, the pressure in the bubbler, and the bubbler temperature in order to obtain the desired process gas flow rates. As discussed above, the desired process gas flow rates are transferred to process gas control subroutine 83 as process parameters. Furthermore, process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure, and bubbler temperature are monitored, compared to the necessary values and adjusted accordingly.

Pressure control subroutine 85 comprises program code for controlling the pressure in processing chamber 15 by regulating the size of the opening of the throttle valve in the chamber's exhaust system. The size of the throttle valve's opening is set to control the chamber pressure to the desired level in relation to the total process gas flow, size of process chamber 15, and pumping set-point pressure for the exhaust system. When pressure control subroutine 85 is invoked, the target pressure level is received as a parameter from chamber manager subroutine 77a. Pressure control subroutine 85 operates to measure the pressure in processing chamber 15 by reading one or more conventional pressure manometers connected to the chamber, to compare the measured value(s) to the target pressure, to obtain PID (proportional, integral, and differential) values from a stored pressure table corresponding to the target pressure, and to adjust the throttle valve according to the PID values obtained from the pressure table. Alternatively, pressure control subroutine 85 can be written to open or close the throttle valve to a particular opening size to regulate processing chamber 15 to the desired pressure.

Heater control subroutine 87 comprises program code for controlling the current to a heating unit that is used to heat the substrate. Heater control subroutine 87 is also invoked by chamber manager subroutine 77a and receives a target, or set-point, temperature parameter. Heater control subroutine 87 measures temperature by measuring voltage output of a thermocouple located in pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table or by calculating the temperature using a fourth-order polynomial. When an embedded loop is used to heat pedestal 12, heater control subroutine 87 gradually controls a ramp up/down of current applied to the loop. Additionally, a built-in fail-safe mode can be included to detect process safety compliance, and can shut down operation of the heating unit if process chamber 15 is not configured properly.

Plasma control subroutine 90 comprises code for setting the low and high frequency RF power levels applied to the process electrodes in processing chamber 15, and for setting the low frequency RF frequency employed. Plasma control subroutine 90 also includes program code for turning on and setting/adjusting the power levels applied to the magnetron or other microwave source used in the present invention. Plasma control subroutine 90 is invoked by chamber manager subroutine 77a, in a fashion similar to the previously described chamber component subroutines.

The above description is mainly for illustrative purposes. Other plasma CVD equipment employing mixed-frequency techniques may be used to deposit a layer of the present invention. Additionally, variations of the above-described system, such as variations in pedestal design, heater design, RF power frequencies, and location of RF power connections, as well as other alterations, are possible. For example, the substrate could be heated by quartz lamps. It should be recognized that the present invention is not necessarily limited to use with any specific apparatus.

III. Exemplary Structure

Figure 2:
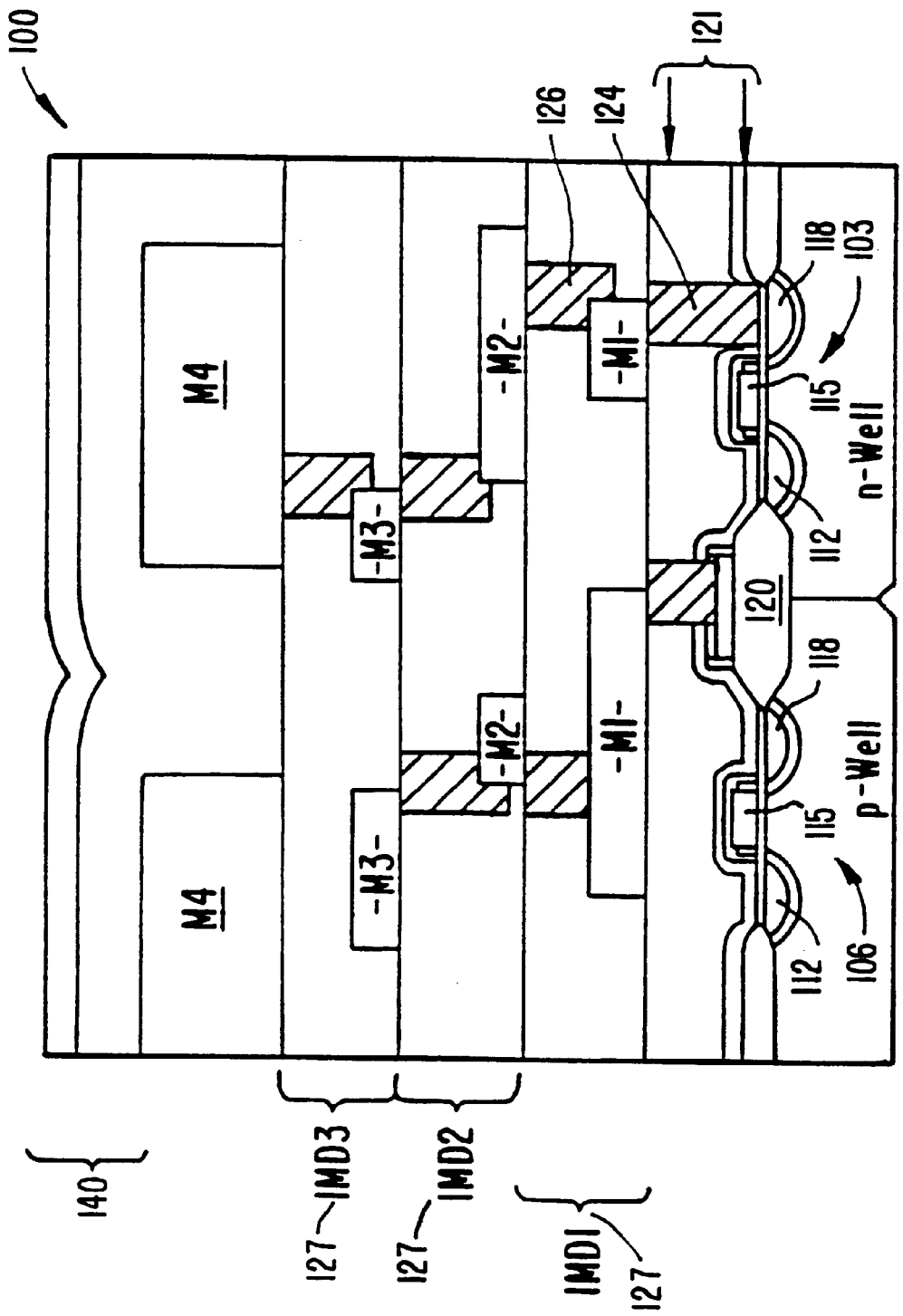
FIG. 2 is a simplified cross-sectional view of an integrated circuit according to the present invention.

FIG. 2 illustrates a simplified cross-sectional view of an integrated circuit 100 incorporating features of the present invention. As shown in FIG. 2, integrated circuit 100 includes NMOS and PMOS transistors 103 and 106, which are separated and electrically isolated from each other by a field oxide region 120. Each transistor 103 and 106 comprises a source region 112, a gate region 115, and a drain region 118.

A premetal dielectric layer 121 separates transistors 103 and 106 from metal layer M1, with connections between metal layer M1 and the transistors made by contacts 124. Metal layer M1 is one of four metal layers, M1–M4, included in integrated circuit 100. Each metal layer M1–M4 is separated from adjacent metal layers by respective intermetal dielectric layers 127 (IMD1, IMD2 and IMD3). Adjacent metal layers are connected at selected openings by vias 126. Deposited over metal layer M4 are planarized passivation layers 140.

Embodiments of the present invention are particularly useful for IMD layers (e.g., intermetal dielectric layers 127), but may find uses in each of the dielectric layers shown in integrated circuit 100. It should be understood that the simplified integrated circuit 100 is for illustrative purposes only. One of ordinary skill in the art could implement the present method for fabrication of other integrated circuits such as microprocessors, application-specific integrated circuits (ASICs), memory devices, and the like. Additionally, the method of the present invention may be used in the fabrication of integrated circuits using other technologies such as BiCMOS, NMOS, bipolar and others.

IV. Dielectric Films Formed Using Carbon and Fluorine

Figure 3:
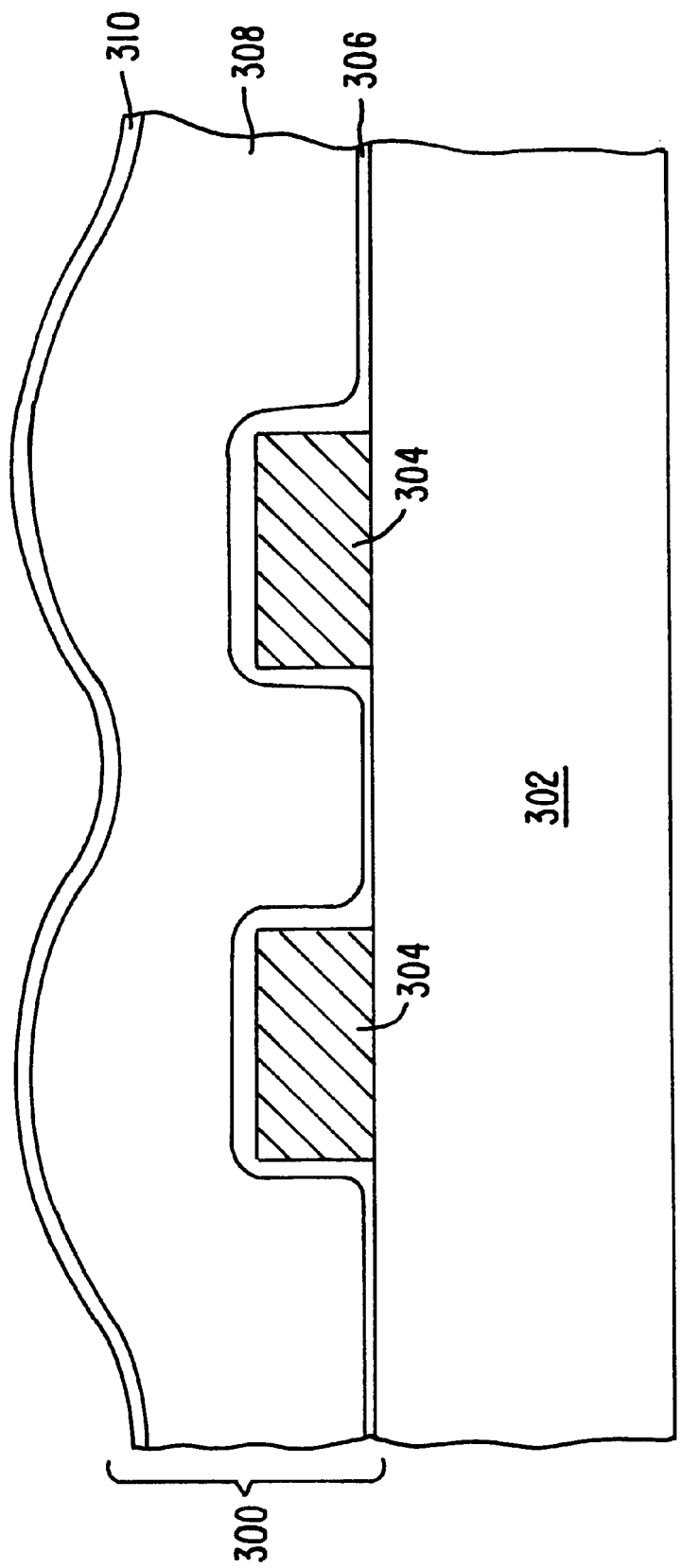
FIG. 3 is a simplified cross-sectional view of a dielectric film deposited according to the present invention.

Referring now to FIG. 3, an dielectric film 300 formed according to an embodiment of the present invention is shown. Dielectric film 300 may be formed over a stepped topography that includes features such as an underlying layer 302 and a metal lines 304. Dielectric film 300 may, for example, be used in any of the dielectric layers of circuit 100. Dielectric film 300 optionally includes a lining layer 306 to provide better adhesion between dielectric film 300 and underlying layer 302, and to reduce dopant outgassing.

A doped carbon layer 308 is then deposited over lining layer 306. By the inclusion of a halogen dopant, this layer is deposited in a manner that reduces the overall dielectric constant of dielectric film 300 and provides desirable gap-fill characteristics. Dielectric film 300, when formed according to embodiments of the present invention, exhibits a dielectric constant of between 2.2 and 3.5. Moreover, by carefully controlling the low-frequency RF power applied during its deposition, doped carbon layer 308 may be made to exhibit improved film stability (e.g., reduced film shrinkage and outgassing). Optionally, a cap layer 310 may then be deposited over doped carbon layer 308. Cap layer 310 is preferably a layer of undoped α-carbon, and provides benefits similar to those of lining layer 306.

In one specific embodiment, doped carbon layer 308 is a halogen-doped diamond-like carbon (DLC) material formed from a process gas including sources of carbon and fluorine, such as methane ($CH_4$) and octa-fluoro-cyclo-butane ($C_4F_8$), respectively. Other carbon sources may also be used, including Freon-14 ($CF_4$), acetylene, or other hydrocarbons. Preferably, the present invention also employs DLC for lining layer 306 and capping layer 310. Also termed "amorphous carbon," "hard carbon," or "α-carbon," DLC is an amorphous material with many, but not all, the properties of diamond. DLC is a chemically inert, amorphous dielectric material. The layers which make up dielectric film 300 may be deposited using conventional deposition systems, including systems that employ parallel-plate RF deposition or other techniques. The use of DLC in the layers of the present invention permits the formation of dielectric film 300 entirely within a single substrate processing system (i.e., in situ).

For example, a PECVD substrate processing system, such as CVD system 10, may be employed to deposit an dielectric film of the present invention. Alternatively, a high-density plasma CVD (HDP-CVD) substrate processing system, such as that described in previously-incorporated patent application Ser. No. 08/774, 930, may be used to deposit a complex structure (also known as a stack). For example, the various layers of dielectric film 300 could be deposited in such a system, followed by the deposition of a dielectric antireflective coating (DARC) layer composed of, for example, silicon oxynitride, and capable of acting as an etch stop layer. Such a DARC layer is described in application Ser. No. 08/852,788, filed May 7, 1997, entitled "IN SITU DEPOSITION OF A DIELECTRIC OXIDE LAYER AND ANTI-REFLECTIVE COATING," having David Cheung, Judy H. Huang, and Wai-Fan Yau as inventors, the disclosure of which is included herein by reference. Alternatively, a silicon-rich silicon oxide layer could be deposited. The deposition of such layers would permit the formation of a stack useful in damascene applications, such as those described in application Ser. No. 08/852,788, as above. Moreover, such a process could be performed in situ (i.e., without removing the substrate being processed from the substrate processing system between the deposition of such layers).

Figure 4:
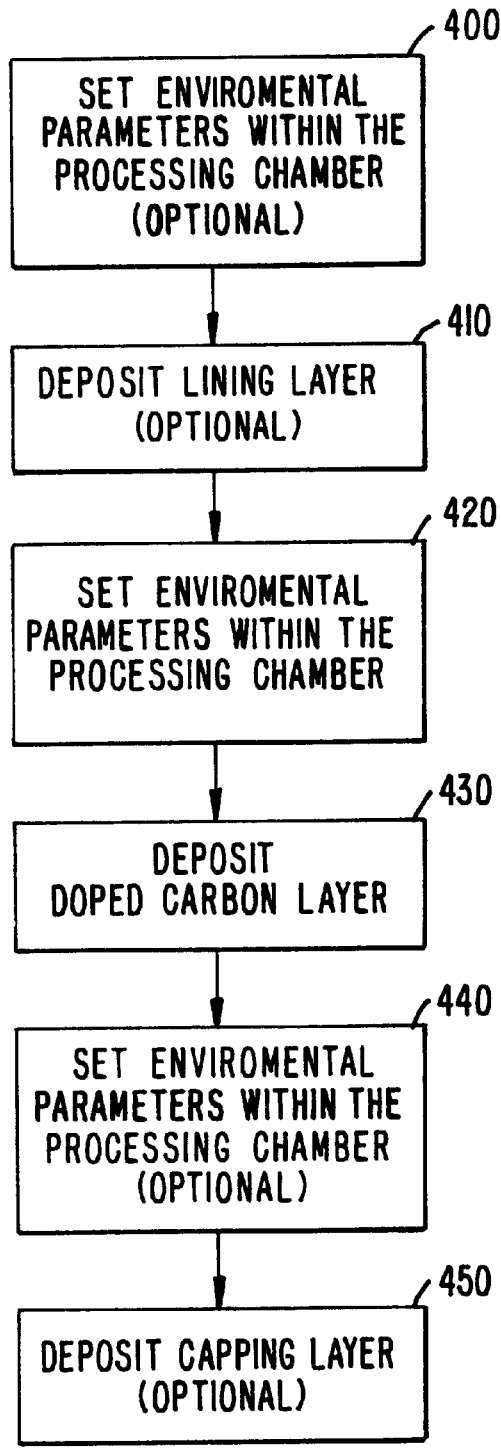
FIG. 4 is a flow chart illustrating the steps performed in applying a dielectric film according to a process of the present invention.

Formation of dielectric film 300 using embodiments of the present invention will now be described by referring to the flow diagram 400 of FIG. 4. Portions of dielectric film 300 are referred to with respect to FIG. 3, and elements of the substrate processing system are referred to with respect to FIGS. 1A–1D. Preferably, dielectric film 300 is formed on underlying layer 302 using an in situ PECVD process, where the substrate being processed remains in the same processing chamber throughout the deposition of lining layer 306, doped carbon layer 308, and capping layer 310. Alternatively, each layer (or a combination of layers) could be deposited in different processing chambers. First, process parameters are stabilized in processing chamber 15 at step 400. The parameters chosen depend on whether lining layer 306 will be deposited, or if doped carbon layer 308 will be deposited directly onto underlying layer 302. Next, lining layer 306 may be deposited, if desired (step 410).

According to a preferred embodiment, lining layer 306 is an undoped DLC layer formed in a PECVD chamber such as CVD system 10. The layer is formed from a process gas that preferably includes methane. Methane is preferably introduced into processing chamber 15 at a rate of between about 10 sccm and 150 sccm, and most preferably at a rate of about 100 sccm. While the process gas is introduced into processing chamber 15, temperature, pressure, and other processing conditions are set. In this embodiment, a chamber pressure of about 500 millitorr and 3 torr is maintained while depositing lining layer 306. Preferably, CVD system 10 sets the chamber pressure to about 1 torr. The temperature in processing chamber 15 is maintained between about 100° C. and 400° C., and preferably at a temperature of 325° C.

Lining layer 306 may be formed using a plasma generated by the application of either single or mixed frequency RF power. Preferably, lining layer 306 is deposited using a single frequency RF power source. High frequency RF source RF1 supplies between about 75 W and 200 W at a frequency of about 13.56 MHz, which translates to a power density of between about 0.06 W/cm$^2$ and 0.16 W/cm$^2$. Preferably, high-frequency RF source RF1 supplies about 120 W of RF power, translating to a power density of about 0.09 W/cm$^2$. High-frequency RF source RF1 is preferably operated at a frequency of 13.56 MHz, as noted, although frequencies between about 2 MHz and 20 MHz may be employed. Also preferably, no low-frequency RF power component is applied during the deposition of lining layer 306.

The plasma is maintained for a period sufficient to deposit lining layer 306 to a thickness of between about 100 Å and 300Å. Lining layer 306, because it is undoped, provides improved adhesion between doped carbon layer 308 and underlying layer 302. Relative to simply depositing doped carbon layer 308 directly onto underlying layer 302, the use of lining layer 306 reduces the possibility of dielectric film 300 delaminating from underlying layer 302 during subsequent processing, although it is possible to successfully deposit carbon layer 308 directly onto underlying layer 302. Additionally, lining layer 306 helps to prevent outgassing of the dopant used in doped carbon layer 308 by acting as a barrier to migration of the dopant employed. To minimize the overall dielectric constant of dielectric film 300, however, the thickness of lining layer 306 must be kept to a minimum because the dielectric constant of lining layer 306 is significantly higher than that of doped carbon layer 308. Alternatively, doped carbon layer 308 may be deposited directly on underlying layer 302.

If lining layer 306 is deposited, process parameters in processing chamber 15 may again require stabilization in preparation for the deposition of doped carbon layer 308 (step 420). In a preferred embodiment, a chamber pressure between about 500 millitorr and 3 torr is maintained while depositing doped carbon layer 308. Preferably, the chamber pressure is set to about 1 torr by CVD system 10. The temperature in processing chamber 15 is maintained between about 100° C. and 400° C., and preferably at a temperature of 325° C.

Once the chamber parameters have been stabilized, either in step 400 or step 420, doped carbon layer 308 is deposited at step 430. According to a preferred embodiment, doped carbon layer 308 is a DLC layer, doped with a halogen such as fluorine and formed in a PECVD chamber such as CVD system 10. To begin the deposition of doped carbon layer 308, a process gas is introduced into process chamber 15 and a plasma formed therefrom. The process gas is a gaseous mixture that preferably includes a gaseous source of carbon and a gaseous source of fluorine. For example, a preferable gas mixture includes methane and octa-fluoro-cyclo-butane ($C_4F_8$). Methane is preferably introduced into processing chamber 15 at a rate of between about 0 sccm (indicating that methane can be entirely eliminated from the process of depositing doped carbon layer 308, if desired) and 150 sccm, and most preferably at a rate of about 100 sccm. $C_4F_8$ is preferably introduced into processing chamber 15 at a rate of between about 5 sccm and 100 sccm, and most preferably at a rate of about 50 sccm. Preferably, $C_4F_8$ and methane are introduced into process chamber 15 in a ratio of 0.8:1 ($C_4F_8$ to methane). The relative quantities of carbon and fluorine may be varied to attain different film characteristics. For example, a lower dielectric constant film is produced by increasing the percentage of fluorine used in the process gas, while film stability is increased by decreasing the amount of fluorine usec.

After processing conditions are set, RF power supply 44 applies RF power to gas distribution faceplate 13a to form a plasma from the process gases within the cylindrical region between faceplate 13a and pedestal 12, thereby depositing doped carbon layer 308. RF power supply 44 is configured to deliver mixed-frequency RF power, with high-frequency RF source RF1 supplying between about 75 W and 200 W at a frequency of about 13.56 MHz (translating to a power density of between about 0.06 W/cm$^2$ and 0.16 W/cm$^2$), and most preferably about 120 W of RF power at that frequency (translating to a power density of about 0.09 W/cm$^2$). High-frequency RF source RF1 is preferably operated at a frequency of 13.56 MHz, as noted, although frequencies between about 2 MHz and 20 MHz may be employed. Also preferably, doped carbon layer 308 is deposited with low-frequency RF source RF2 supplying between about 5 W and 75 W at a frequency of about 350 kHz (translating to a power density of between about 0.004 W/cm$^2$ and 0.06 W/cm$^2$), and most preferably about 35 W of RF power at that frequency (translating to a power density of about 0.03 W/cm$^2$). Low-frequency RF source RF2 is preferably operated at a frequency of 350 kHz, as noted, although frequencies between about 200 kHz and 2 MHz may be employed. Preferably, low-frequency RF source RF2 is applied to the electrode opposite the electrode upon which the substrate being processed is disposed (e.g., gas distribution faceplate 13a).

As noted in the section on Experimental Results, low-frequency RF power in excess of about 75 W (i.e., 0.06 W/cm$^2$) serves no particular purpose with regard to film shrinkage, and can cause excessive dissociation of the halogen-containing gas, leading to etching of the substrate and the processing chamber's interior surfaces. Additionally, it is desirable to maximize system throughput by using a low-frequency RF power level that maximizes deposition rate of doped carbon layer 308 while providing the desired film qualities.

If desired, a capping layer 310 may be deposited over the doped carbon layer 308. This provides benefits similar to those provided by lining layer 306. The deposition of capping layer 310 parallels that of lining layer 306. Deposition of capping layer 310 begins with the stabilization of process parameters within processing chamber 15 (step 440). According to a preferred embodiment, capping layer 310 is an undoped DLC layer formed in a PECVD chamber such as CVD system 10. The layer is formed from a process gas that preferably includes methane. Methane is preferably introduced into processing chamber 15 at a rate of between about 10 sccm and 150 sccm, and most preferably at a rate of about 100 sccm.

While the process gas is introduced into processing chamber 15, temperature, pressure, and other processing conditions are adjusted to permit the deposition of capping layer 310 at step 440. A chamber pressure of about 500 millitorr and 3 torr is maintained while depositing capping layer 310. Preferably, CVD system 10 sets the chamber pressure to about 1 torr. The temperature in processing chamber 15 is maintained between about 100° C. and 400° C., and preferably at a temperature of 325° C.

Capping layer 310 is then deposited at step 450. Capping layer 310 may be formed using a plasma generated by the application of either single or mixed frequency RF power. Preferably, capping layer 310 is deposited using a single frequency RF power source, with high frequency RF source RF1 supplying between about 75 W and 200 W at a frequency of about 13.56 MHz, translating to a power density of between about 0.06 W/cm$^2$ and 0.16 W/cm$^2$. Preferably, high-frequency RF source RF1 supplies about 120 W of RF power, translating to a power density of about 0.09 W/cm$^2$. High-frequency RF source RF1 is preferably operated at a frequency of 13.56 MHz, as noted, although frequencies between about 2 MHz and 20 MHz may be employed. Also preferably, no low-frequency RF power component applied during the deposition of capping layer 310.

The plasma is maintained for a period sufficient to deposit capping layer 310 to a thickness of between about 100 Å and 300Å. Capping layer 310, because it is undoped, improves adhesion between doped carbon layer 308 and subsequently-deposited layers, reducing the possibility delamination. Capping layer 310 also reduces the possibility of outgassing from doped carbon layer 308. Minimizing the overall dielectric constant of dielectric film 300, however, requires the thickness of capping layer 310 be kept to a minimum.

Alternatively, one or more subsequent layers may be deposited directly on doped carbon layer 308. For example, a layer of silicon oxynitride such as a DARC layer of the type previously described, a silicon-rich silicon oxide layer, or other layer may be deposited directly on doped carbon layer 308. An advantage of the present invention is the ability to deposit the layers of dielectric film 300 and the other layers mentioned herein (e.g., a DARC layer) on a substrate without removing the substrate from the processing chamber of, for example, CVD system 10. This increases throughput and reduces the risk of contamination.

Other carbon sources (including other hydrocarbons such as acetylene) may also be used to form the various layers of dielectric film 300 in a process according to the present invention. Other fluorine sources, such as $NF_3$, $CF_4$, $C_2F_6$, and others, may also be used to form doped carbon layer 308 in a process according to the present invention. Alternatively, a single gas such as $CF_4$ or $C_2F_6$, may be used in the deposition of doped carbon layer 308. The resulting dielectric film has a reduced dielectric constant and good gap-filling capabilities. Such a dielectric film is well-suited to IMD applications, for example, and may be used to fill a gap in a substantially void-free manner between adjacent conductive lines having an aspect ratio of up to 2:1, or more.

The above-described gas introduction rates are based on depositing the layers of dielectric film 300 in a resistively-heated PECVD chamber manufactured by Applied Materials that is outfitted for 8-inch substrates. As a person of ordinary skill in the art would understand, gas flow rates, temperatures, pressures, RF powers, and other parameters will vary if other chambers of different design and/or volume are employed. Thus, the parameters listed in the above process should not be viewed as limiting the claims as described herein. One of ordinary skill in the art would also realize that other chemicals, environmental parameters, and conditions could also be employed in practicing the present invention.

V. Experimental Results

A series of substrates, each having a dielectric film of the present invention deposited thereon, were examined in order to verify the expected film properties. A PECVD system similar to CVD system 10 was used to deposit a dielectric film of the present invention on each of the substrates while varying the power from the low-frequency RF power source applied to form the plasma. The dielectric film included a lining layer and a capping layer, as previously described. Once deposited, the dielectric film on each substrate was annealed at 400° C. in a nitrogen ($N_2$) atmosphere for approximately 60 minutes. The following observations apply only to a dielectric film of the present invention formed in the manner described above.

Figure 5:
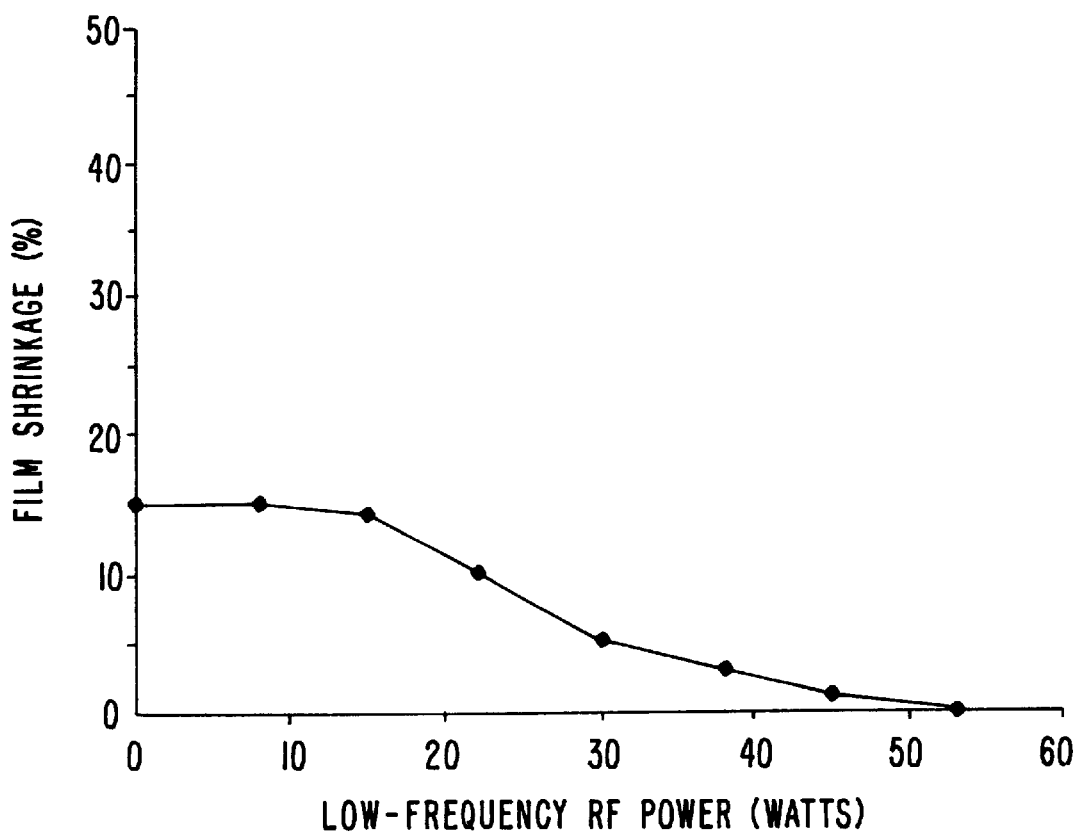
FIG. 5 is a graph of film shrinkage of a dielectric film of the present invention versus the low-frequency RF power used in depositing the film.

FIG. 5 illustrates a graph of film shrinkage of the resulting dielectric film versus the low-frequency RF power used in depositing the film. Low-frequency RF power was varied from 0 W to about 53 W. As can be seen, film shrinkage is about 15% with no low-frequency RF power applied. From that point, film shrinkage falls, until no shrinkage is detected in a film deposited using a low-frequency RF power of about 53 W. The inventors discovered that by adjusting the low-frequency RF power applied in forming the plasma, film shrinkage could be reduced using the method of the present invention. It was also found that, while the use of more low-frequency RF power (up to about 75 W) would be useful to ensure that no film shrinkage occurs, additional low-frequency RF power (e.g., 100 W) would serve no particular purpose with regard to film shrinkage. Moreover, additional low-frequency RF power can cause excessive dissociation of the halogen-containing gas, which can lead to etching of the substrate and the processing chamber's interior surfaces.

Figure 6:
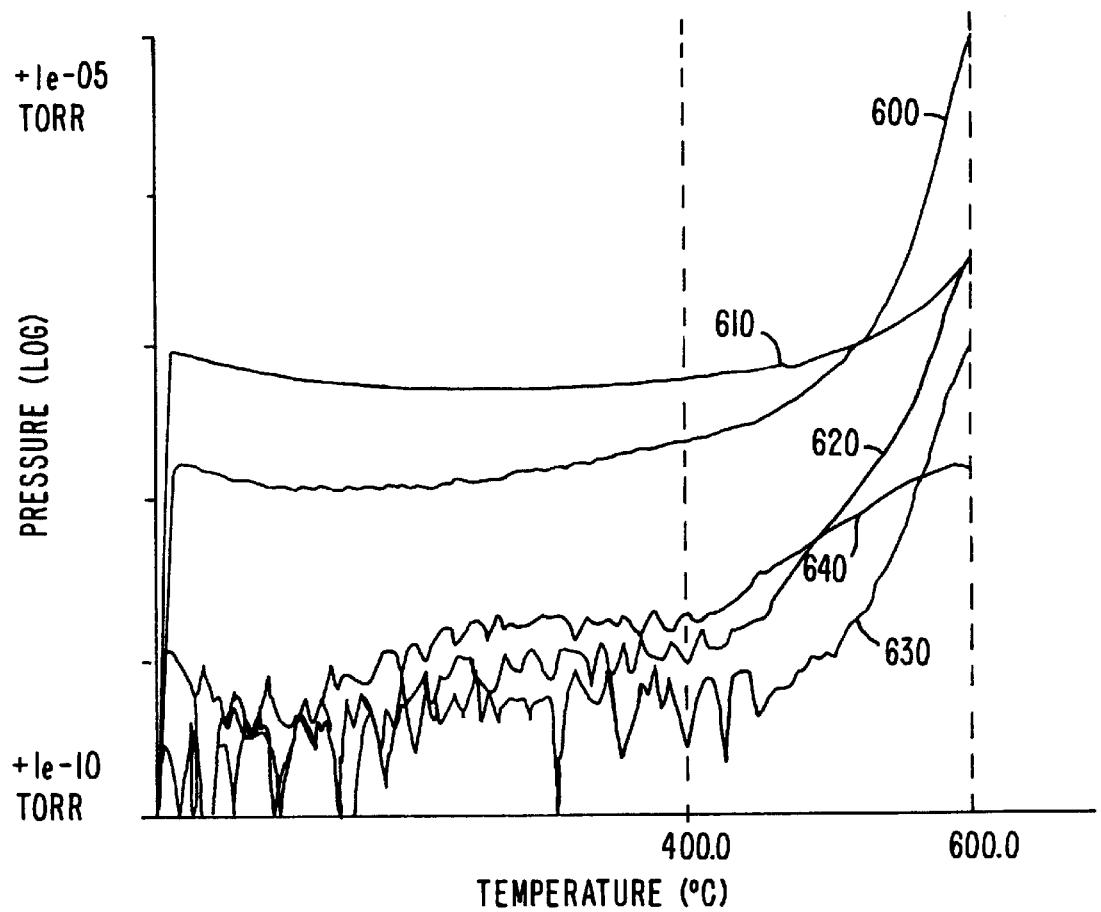
FIG. 6 is a graph of partial pressures of substances outgassed during the heating of the substrates after annealing.

FIG. 6 illustrates a graph of partial pressures of substances released (outgassed) during the heating of the substrates after annealing. The film tested was deposited using the preferred parameters described previously, except that a low-frequency RF power level of 55 W was employed in its deposition. As the temperature is increased from 0° C., a small amount of outgassing of certain substances is apparent in FIG. 6, as illustrated by the partial pressure of certain compounds. A trace 600, representing HF, rises slightly until the temperature reaches approximately 400° C., at which point the partial pressure of HF begins to rise rapidly. This indicates that the present invention significantly reduces the outgassing of HF at temperatures below approximately 400° C. A trace 610, representing fluorine, remains substantially constant until approximately 500° C., at which point the partial pressure of HF begins to rise slowly. A trace 620, representing CF, exhibits variability but remains substantially at or below a relatively constant value until approximately 400° C., at which point the partial pressure of CF begins to rise slowly. A trace 630, representing $CF_2$, exhibits variability but remains substantially at or below a relatively constant value until approximately 400° C., at which point the partial pressure of $CF_2$ begins to rise slowly. A trace 640, representing $CH_3$, exhibits variability but remains substantially at or below a relatively constant value until approximately 500° C., at which point the partial pressure of $CH_3$ begins to rise rapidly.

The inventors thus discovered that a dielectric film of the present invention improves film stability by reducing outgassing. This is indicated in the graph of FIG. 6 by the relatively constant partial pressures observed up to a temperature of about 400° C. to 500° C. The inventors also discovered, as illustrated by trace 640, that film stability must also be determined with regard to constituents other than just the dopant(s) employed. Given the enhanced stability of a doped carbon layer deposited in the manner described above, then, the film's dielectric constant can be expected to remain substantially unaffected during subsequent processing of such a dielectric film, so long as the film's temperature does not exceed about 400° C.

Figure 7:
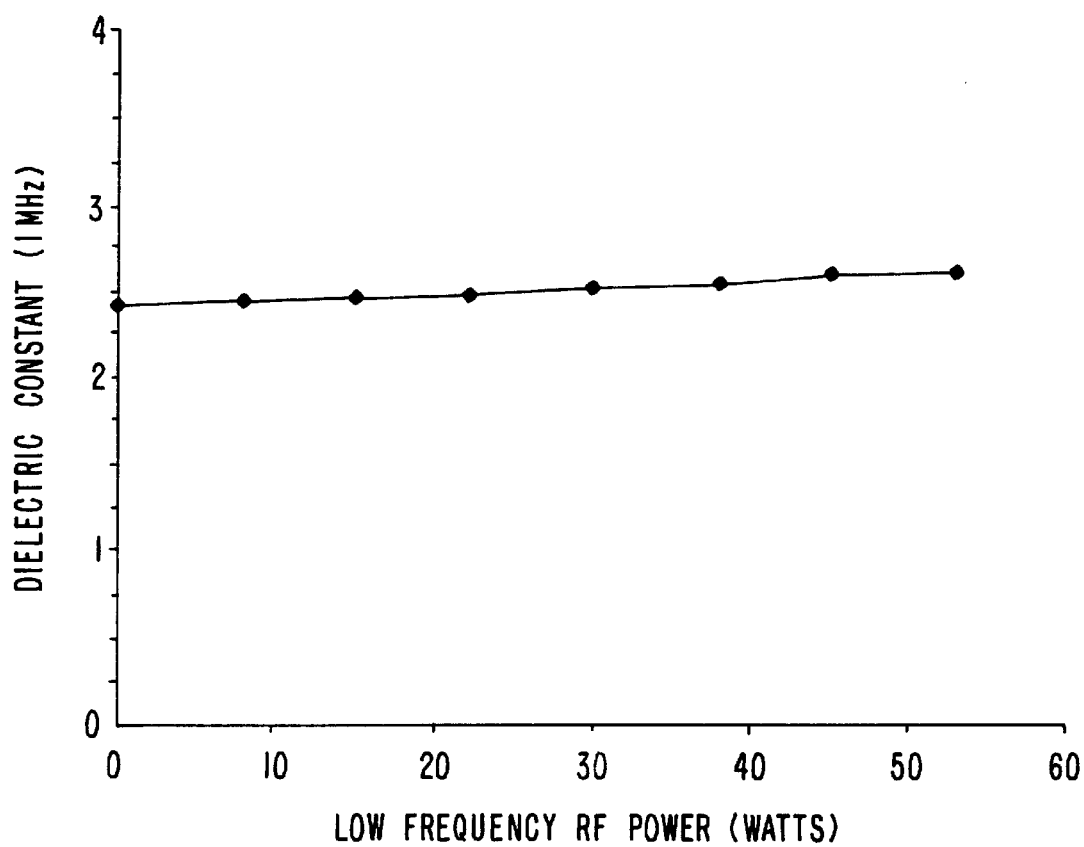
FIG. 7 is a graph of dielectric constant versus low-frequency RF power.

With regard to the dielectric constant of the deposited film, FIG. 7 shows a graph of dielectric constant versus low-frequency RF power applied in forming the plasma. The dielectric constant of each dielectric film deposited was measured at a frequency of 1 MHz using a mercury probe. The dielectric constant was found to remain substantially constant at about 2.4–2.5 for low-frequency RF power levels of between 0 W and about 50 W. The inventors thus determined that an optimal low-frequency RF power level could be selected without having a significant effect on the dielectric film's dielectric constant.

Figure 8:
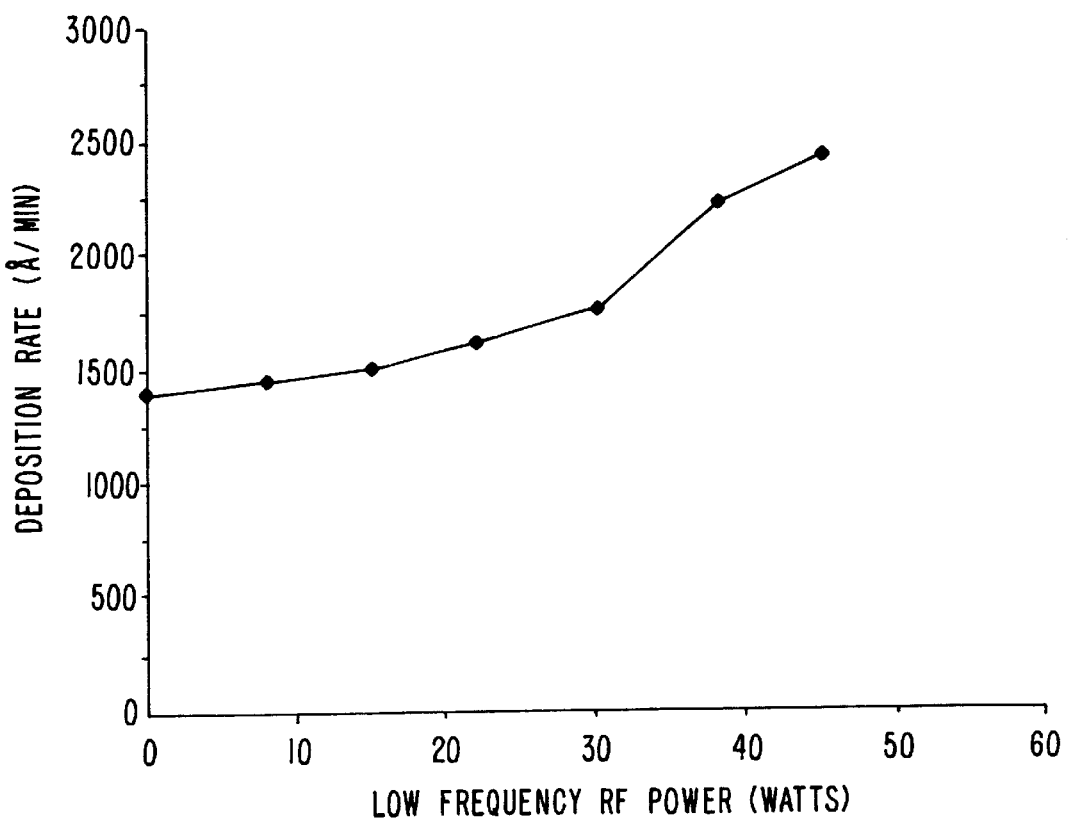
FIG. 8 is a graph of the deposition rate of the dielectric film versus the low-frequency RF power used in depositing the film.

FIG. 8 illustrates a graph of the deposition rate of the dielectric film versus the low-frequency RF power used in depositing the film. Low-frequency RF power was varied from 0 W to about 46 W. The inventors discovered that the film's deposition rate was about 1400 Å/min with no low-frequency RF power applied. From that point, the film's deposition rate was found to increase slowly, up to about 30 W of low-frequency RF power, at which point a deposition rate of about 1750 Å/min was observed. Deposition rate was found to increase relatively rapidly after that point. Using a low-frequency RF power of about 46 W, the film's deposition rate was found to be about 2400 Å/min. Thus, the inventors discovered that at the preferred level of low-frequency RF power contemplated by the present invention, the a relatively high deposition rate (in comparison to using only a high-frequency RF power source) could be achieved.

The inventors thus discovered that outgassing and film shrinkage can be controlled while maintaining an acceptable deposition rate by adjusting the low-frequency RF power applied during the film's deposition. Moreover, it was discovered that these film characteristics can be optimized without any significant adverse affects on the film's dielectric constant.

The method of the present invention is not intended to be limited by the specific parameters set forth above. Those of ordinary skill in the art will realize that different processing conditions and different reactant sources can be used without departing from the spirit of the invention. For example, carbon sources other than $CH_4$ such as $CF_4$, $C_2F_6$, and others and fluorine sources other than $C_4F_8$ such as $NF_3$, $CF_4$, $C_2F_6$, and others can be used to deposit a layer of the present invention. Moreover, halogens other than fluorine can be used as the dopant in a dielectric film of the present invention. Other plasma CVD equipment employing mixed-frequency techniques such as a high-density plasma CVD system employing a mixed-frequency, capacitively-coupled RF bias, or the like may be employed in depositing a layer of the present invention. Other equivalent or alternative methods of depositing a dielectric film according to the present invention will be apparent to those skilled in the art. These equivalents and alternatives are intended to be included within the scope of the present invention. Accordingly, it is not intended to limit the invention except as provided in the appended claims.

What is claimed is:

1. A method of depositing a film onto a substrate disposed in a processing chamber, said method comprising:

flowing a first process gas comprising a first gaseous source of carbon and a gaseous source of a halogen into the processing chamber;

exciting said first process gas using a first RF component having a first frequency and a second RF component having a second frequency to form a deposition plasma from said first process gas, wherein said first frequency is higher than said second frequency, with said second RF component having a power density in the range of 0.004 W/cm$^2$ to 0.06 W/cm$^2$, inclusive; and maintaining excitation of said deposition plasma for a first period of time to deposit a halogen-doped carbon-based layer.

2. The method of claim 1 wherein said second frequency is between about 200 kHz and 2 MHz.

3. The method of claim 2 wherein said method further comprises annealing said dielectric film in a nitrogen atmosphere at a temperature of above 350° C.

4. The method of claim 2 wherein said halogen is a fluorine source.

5. The method of claim 4 wherein said fluorine source is $C_4F_8$.

6. The method of claim 5 wherein said first gaseous source of carbon is $CH_4$.

7. The method of claim 2, further comprising the step of depositing a carbon-based lining layer, said step of depositing said carbon-based lining layer performed prior to said step of flowing said first process gas into the chamber, by:

flowing a second process gas comprising a second gaseous source of carbon into the processing chamber;

exciting said second process gas using a third RF component to form an initial plasma from said second process gas;

maintaining said excitation of said initial plasma with said third RF component for a second period of time to deposit said carbon-based lining layer.

8. The method of claim 7 wherein said second period of time is of such a duration that said carbon-based lining layer is deposited to a thickness of between about 100 Å and 300 Å.

9. The method of claim 7 wherein said second gaseous source of carbon is a hydrocarbon.

10. The method of claim 9 wherein said hydrocarbon is $CH_4$.

11. The method of claim 9 wherein a frequency of said third RF component is between about 2 MHz and 20 MHz.

12. The method of claim 2, further comprising the step of depositing a carbon-based capping layer, said step of depositing said carbon-base capping layer performed after said step of maintaining said excitation for a first period of time, by:

flowing a second process gas comprising a second gaseous source of carbon into the processing chamber;

exciting said second process gas using a third RF component to form an initial plasma from said second process gas;

maintaining excitation of said initial plasma with said third RF component for a second period of time to deposit said carbon-based capping layer.

13. The method of claim 12 wherein said second period of time is of such a duration that said carbon-based capping layer is deposited to a thickness of between about 100 Å and 300 Å.

14. The method of claim 2 wherein said second gaseous source of carbon is a hydrocarbon.

15. The method of claim 14 wherein said hydrocarbon is $CH_4$.

16. The method of claim 14 wherein a frequency of said third RF component is between about 2 MHz and 20 MHz.

17. A substrate processing system for depositing a film, having a shrinkage characteristic associated therewith, on a substrate, comprising:

a processing chamber;

a gas distribution system for introducing a first process gas into said vacuum chamber;

a plasma generation system for creating a plasma from said first process gas within said first vacuum chamber;

a controller for controlling said gas distribution system and said plasma generation system; and a memory coupled to said controller and storing a program for directing the operation of said chemical vapor deposition system, said program including a set of instructions for depositing a dielectric film by first, controlling said gas distribution system to flow a process gas comprising a gaseous source of carbon and a gaseous source of a halogen into said processing chamber;

second, controlling said plasma generation system to excite said process gas using a first RF component having a first frequency and a second RF component having a second frequency to form a plasma from said first process gas, with said second RF component having a power density associated therewith, and establishing said shrinkage characteristics by maintaining said density within a predetermined range; and third, controlling said plasma generation system to maintain excitation of said plasma for a period of time to deposit a halogen-doped carbon-based layer.

18. The apparatus of claim 17 wherein said second RF component has a plasma density of between about 0.004 W/cm$^2$ and 0.06 W/cm$^2$, and said second frequency is between about 200 kHz and 2 MHz.

19. A method of depositing a film, having a shrinkage characteristic associated therewith, onto a substrate disposed in a processing chamber, said method comprising:

flowing a first process gas comprising a first gaseous source of carbon and a gaseous source of a halogen into the processing chamber;

exciting said first process gas using a first RF component having a first frequency and a second RF component having a second frequency to form a plasma from said first process gas, with said second RF component having a power density associated therewith;

establishing said shrinkage characteristic by maintaining said power density at a predetermined density; and maintaining excitation of said plasma for a first period of time to deposit a halogen-doped carbon-based layer.

20. The method as recited in claim 19 wherein said power density is in the range of 0.004 W/cm$^2$ to 0.06 W/cm$^2$, inclusive.

21. The method as recited in claim 19 wherein film has a dielectric constant associated therewith and said establishing said shrinkage characteristic includes establishing said shrinkagp characteristic independent of said dielectric constant.

22. The method of claim 19 wherein said method further comprises annealing said dielectric film in a nitrogen atmosphere at a temperature of above 350° C.

23. The method of claim 19 wherein said halogen is fluorine.

24. The method of claim 1 wherein said power density is in the range of 0.03 W/cm$^2$ to 0.06 W/cm$^2$, inclusive.

25. The method of claim 17 wherein said predetermined range is 0.03 W/cm$^2$ to 0.06 W/cm$^2$, inclusive.

26. The method of claim 19 wherein said predetermined range is in the range of 0.03 W/cm$^2$ to 0.06 W/cm$^2$, inclusive.

* * * * *